United States Patent
Kim et al.

(10) Patent No.: US 10,418,944 B2
(45) Date of Patent: Sep. 17, 2019

(54) HIGH-EFFICIENCY HIGH-INTEGRATED RECEIVER

(71) Applicant: Korea Electronics Technology Institute, Seongnam-si, Gyeonggi-do (KR)

(72) Inventors: Ki Jin Kim, Yongin-si (KR); Kwang Ho Ahan, Yongin-si (KR)

(73) Assignee: KOREA ELECTRONICS TECHNOLOGY INSTITUTE, Seongnam-si, Gyeonggi-do (KR)

(*) Notice: Subject to any disclaimer, the term of this patent is extended or adjusted under 35 U.S.C. 154(b) by 286 days.

(21) Appl. No.: 15/385,633

(22) Filed: Dec. 20, 2016

(65) Prior Publication Data

US 2017/0214366 A1    Jul. 27, 2017

(30) Foreign Application Priority Data

Jan. 27, 2016    (KR) .................... 10-2016-0010004

(51) Int. Cl.
*H03F 1/02* (2006.01)
*H03F 3/19* (2006.01)
(Continued)

(52) U.S. Cl.
CPC ............ *H03F 1/0205* (2013.01); *H03F 3/19* (2013.01); *H03F 3/21* (2013.01); *G01S 7/285* (2013.01);
(Continued)

(58) Field of Classification Search
CPC ............ G01S 13/34; G01S 2013/0254; G01S 13/931; G01S 7/352; G01S 13/4463;
(Continued)

(56) References Cited

U.S. PATENT DOCUMENTS 4,721,919 A * 1/1988 LaRosa ................. H03F 3/3081
330/146
6,903,679 B2 * 6/2005 Hanson ............... B60K 31/0008
342/91

(Continued)

FOREIGN PATENT DOCUMENTS

KR    10-2009-0022676 A    3/2009
KR    10-2015-0060255 A    6/2015

OTHER PUBLICATIONS

Office Action issued by the Korean Intellectual Property Office dated May 19, 2017 in the corresponding Korean Patent Application No. KR 10-2016-0010004.

*Primary Examiner* — Olumide Ajibade Akonai
(74) *Attorney, Agent, or Firm* — Knobbe Martens Olson & Bear LLP

(57) ABSTRACT

A high-efficiency high-integrated receiver is provided. The radar receiver according to an embodiment of the present disclosure includes a receiver configured to receive a radar signal, a processor configured to attenuate a magnitude of a low frequency band of the received signal of the receiver, a filter configured to perform a low pass filtering on an output signal of the processor, and an ADC configured to A/D convert the output signal of the filter. Accordingly, it is possible to demodulate all the signals being reflected from targets in various distances when even using a low resolution ADC, thereby reducing the manufacturing cost and power consumption.

4 Claims, 11 Drawing Sheets

(51) Int. Cl.
    *H03F 3/21*         (2006.01)
    *G01S 7/35*         (2006.01)
    *G01S 7/292*        (2006.01)
    *G01S 7/285*        (2006.01)
    *G01S 13/34*       (2006.01)
    *G01S 13/02*       (2006.01)

(52) U.S. Cl.
    CPC ............... *G01S 7/292* (2013.01); *G01S 7/352* (2013.01); *G01S 13/34* (2013.01); *G01S 2013/0254* (2013.01); *H03F 2200/129* (2013.01); *H03F 2200/165* (2013.01); *H03F 2200/294* (2013.01); *H03F 2200/451* (2013.01)

(58) Field of Classification Search
    CPC .......... G01S 13/88; G01S 7/03; G01S 7/4021; G01S 7/285; G01S 7/288; G01S 7/292; H03F 2200/451; H03F 3/195; H03F 2200/165; H03F 2200/333; H03F 3/26
    See application file for complete search history.

(56) References Cited

U.S. PATENT DOCUMENTS

| | | | | |
|---|---|---|---|---|
| 2005/0242985 | A1* | 11/2005 | Ponsford | G01S 7/36 342/59 |
| 2015/0212197 | A1* | 7/2015 | Morita | G01S 7/285 342/92 |
| 2016/0103206 | A1* | 4/2016 | Pavao-Moreira | G01S 13/08 342/104 |
| 2017/0090014 | A1* | 3/2017 | Subburaj | G01S 7/4004 |

\* cited by examiner

HIGH-EFFICIENCY HIGH-INTEGRATED RECEIVER

INCORPORATION BY REFERENCE TO ANY PRIORITY APPLICATIONS

This application claims priority from Korean Patent Application No. 10-2016-0010004, filed on Jan. 27, 2016, in the Korean Intellectual Property Office, the disclosure of which is incorporated herein by reference in its entirety.

BACKGROUND

Field

The present disclosure relates to a radar receiver, and more particularly, to a baseband circuit of a receiver for vehicles, object detection and military radars.

SUMMARY

The present disclosure is directed to solving the aforementioned problems, and therefore to providing a high efficiency radar receiver that enables signal demodulation with a low resolution ADC.

A radar receiver according to an embodiment of the present disclosure for achieving the aforementioned purpose includes a receiver configured to receive a radar signal; a processor configured to attenuate a magnitude of a low frequency band of the received signal of the receiver; a filter configured to perform a low pass filtering on an output signal of the processor; and an ADC configured to A/D convert the output signal of the filter.

In addition, the processor may include a first HPF configured to attenuate the magnitude of the low frequency band of the received signal of the receiver; and a first amplifier configured to amplify an output signal of the first HPF.

Further, the processor may further include a second HPF configured to attenuate the magnitude of the low frequency band of the output signal of the first amplifier; and a second amplifier configured to amplify an output signal of the second HPF.

In addition, the first amplifier may include one pair of first transistors; and first amps configured to negative feedback an emitter of the first transistors to a gate, and amplify a gain of the first transistors; and the second amplifier may include one pair of second transistors; and second amps configured to negative feedback an emitter of the second transistors to the gate, and amplify a gain of the second transistors.

Further, the gain of the first amplifier may be adjusted by a ratio of an first resistance that connects drains of the first transistors and a second resistance that connects the emitters of the first transistors, and the gain of the second amplifier may be adjusted by the ratio of a third resistance that connects drains of the second transistors and a forth resistance that connects the emitters of the second transistors.

In addition, a corner frequency of the second HPF may be lower than a corner frequency of the first HPF.

The gain of the second amplifier may be lower than the gain of the first amplifier.

Meanwhile, a radar receiving method according to another embodiment of the present disclosure includes receiving a radar signal; attenuating a magnitude of a low frequency band of the received signal; performing a low pass filtering on the attenuated signal; and A/D converting the filtered signal.

As aforementioned, according to the embodiments of the present disclosure, it is possible to demodulate all the signals being reflected from targets in various distances when even using a low resolution ADC, thereby reducing the manufacturing cost and power consumption.

Further, according to the embodiments of the present disclosure, it is possible to integrate far more elements configuring a radar receiver in one chip, thereby significantly contributing to reduction of power consumption of the entire radar receiver.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present between two elements Like reference numerals refer to like elements throughout.

DETAILED DESCRIPTION

Figure 1:
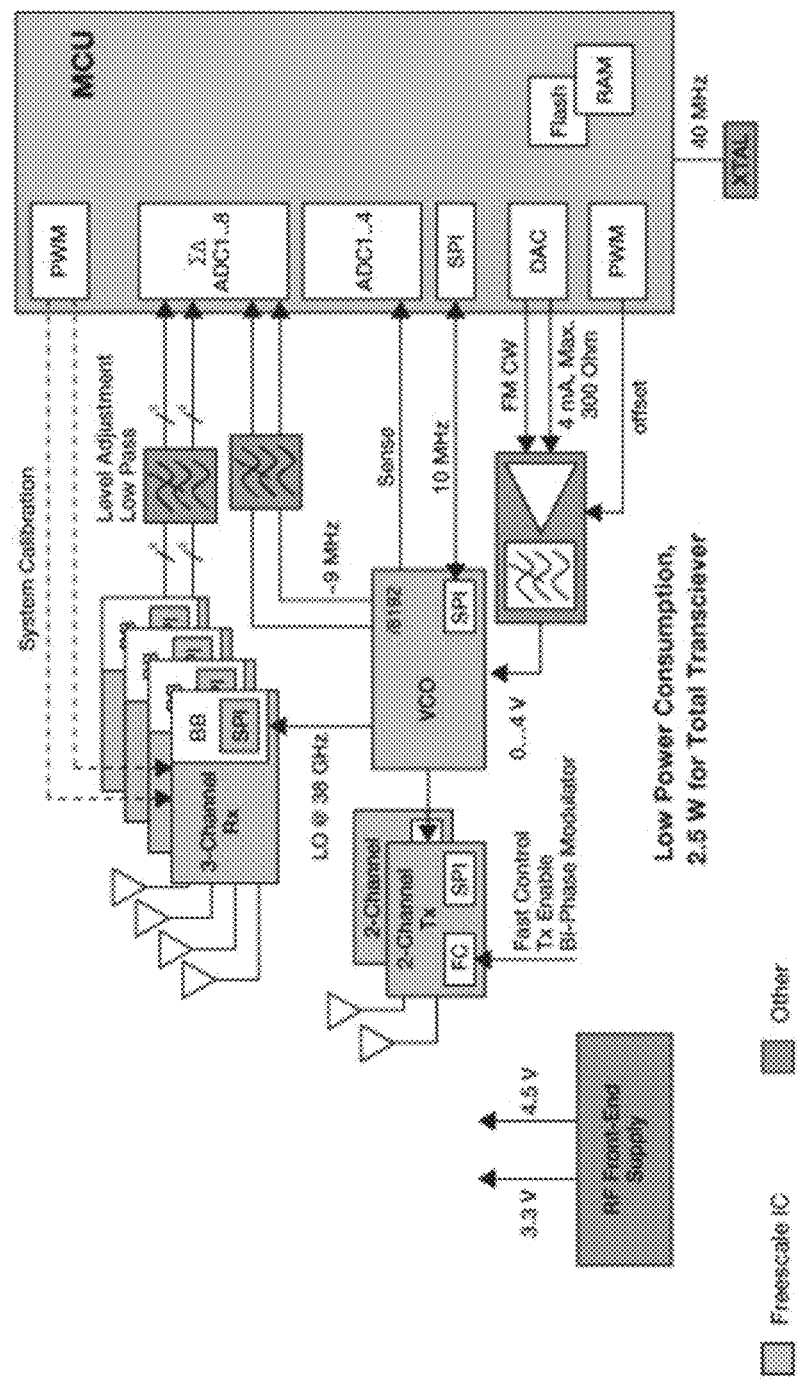
FIG. 1 is a view illustrating a structure of a radar receiver.

FIG. 1 is a view illustrating a structure of a radar receiver. A radar system must receive signals from a target located within a range of a very close distance to a very far distance and demodulate the received signals.

In FIG. 1, configurations displayed are realized in one IC, and as illustrated, one can see that a level adjustment low pass filter (ALPF) is not integrated within a chip.

That is because since a signal that is in a close distance from a radar receiver is applied to the ALPF with a very high power, a circuit having a high linearity is required so as to endure such a situation.

Figure 2:
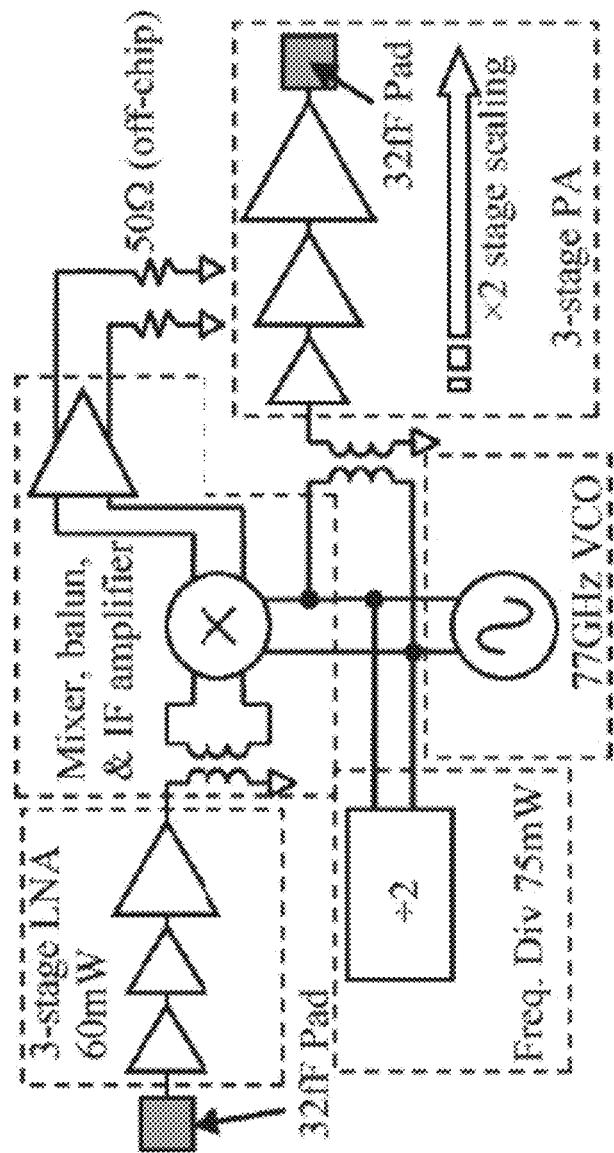
FIG. 2 is a structure of another radar receiver.

FIG. 2 is another radar receiver structure. In the case of the radar receiver illustrated in FIG. 2 as well, the baseband circuit is not integrated within a chip, but an IF amplifier is used to perform analog signal processing outside.

Signals coming into the ALPS from various distances at the same time means that the signals being input have various magnitudes.

Figure 3:
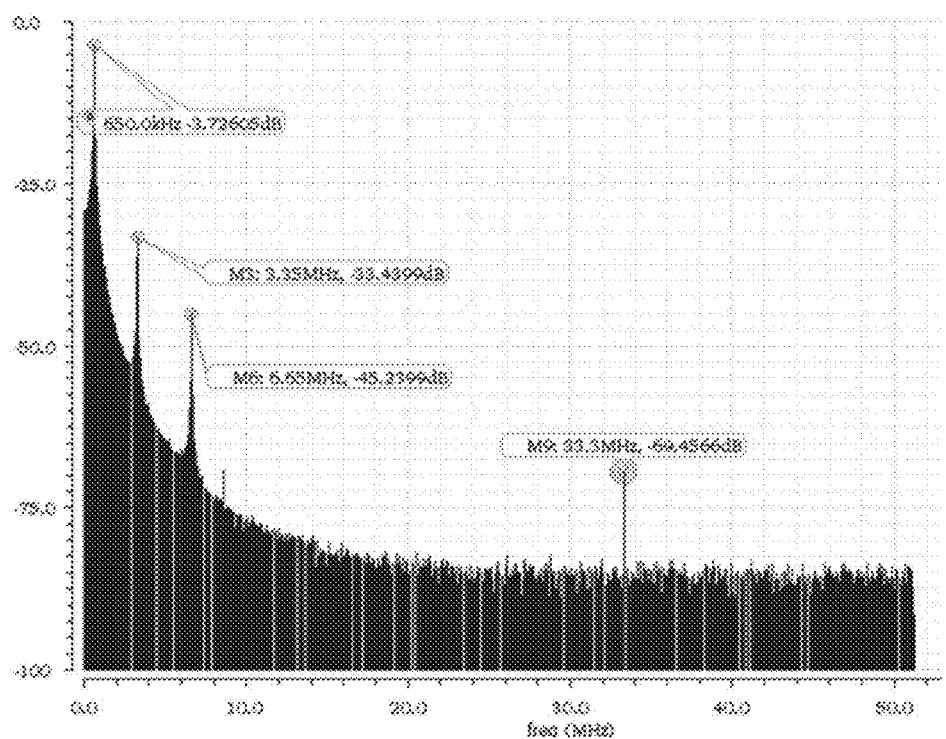
FIG. 3 is a spectrum of signals being input into an ALPF.

FIG. 3 illustrates a spectrum of signals being input into the level adjustment low pass filter (ALPF). FIG. 3 illustrates input signals of the ALPF supposing that a gain of a front end chip of radar is 20 dB, and targets M1, M3, M6, M9 are 1 m, 5 m, 10 m and 50 m away, respectively. In the case of radar, a signal is inversely proportional to a biquadrate of the distance, and thus, there occurs a problem of diversity of the magnitude of input signals as illustrated in FIG. 3.

Figure 4:
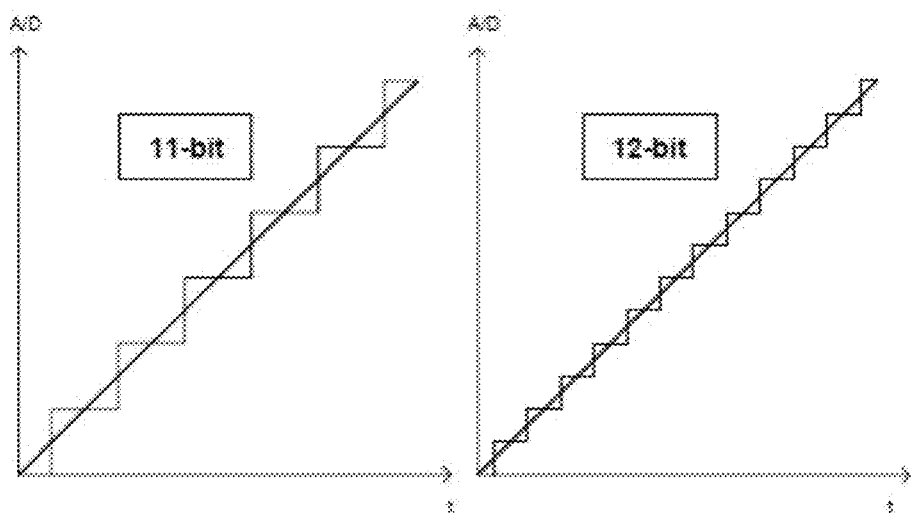
FIG. 4 is a view provided to explain resolutions as a function of number of ADC bits.

Further, this problem increases the output power range of the ALPF, increasing the resolution of the ADC, that is, the next end. The math formula below and FIG. 4 show the ADC resolution characteristics according to the region of an input signal.

$$SNR(dB)=3.02N+1.76$$

In the above math formula, N represents the number of bits.

In FIG. 3, due to the target M1 that is 1 m away, a signal of −3.7 dBm is input at 650 kHz, and supposing 10 dB back-off in order to secure the linearity of the receiver, the IP1 dB of the ALPF must be 6.3 dBm or more.

However, this is a numerical figure that is difficult to be realized with a semiconductor IC. Further, the difference of magnitude between the largest signal and the smallest signal becomes about 66 dB, which can be demodulated when the ADC is at least 11 bit or more.

Such a result is a phenomenon that occurs since the signal is inversely proportional to the biquadrate of the distance from the target.

Moreover, the delta-sigma ADC used in FIG. 1 is a high resolution ADC. Such a high resolution ADC also has a problem where power consumption must be increased by four times as the number of bits increases by 1 bit.

Further, a greater problem is that a high speed ADC is required in recent days, but a high speed high resolution ADC is very expensive, and power consumption increases exponentially as well.

One inventive aspect is a new receiver structure for a high resolution radar system overcoming the problem of price and power.

Hereinafter, an embodiment of the present disclosure will be explained in detail with reference to the exemplary drawings attached. In adding a reference numeral to each element in the drawings, it should be noted that like elements use like reference numerals if possible even if the elements are illustrated in other drawings. Further, in explaining an embodiment of the present disclosure, any specific explanation on a well-known configuration or function regarded as possibly obscuring the main point of the present disclosure will be omitted.

Hereinafter, the present disclosure will be explained in further detail with reference to the drawings attached.

Figure 5:
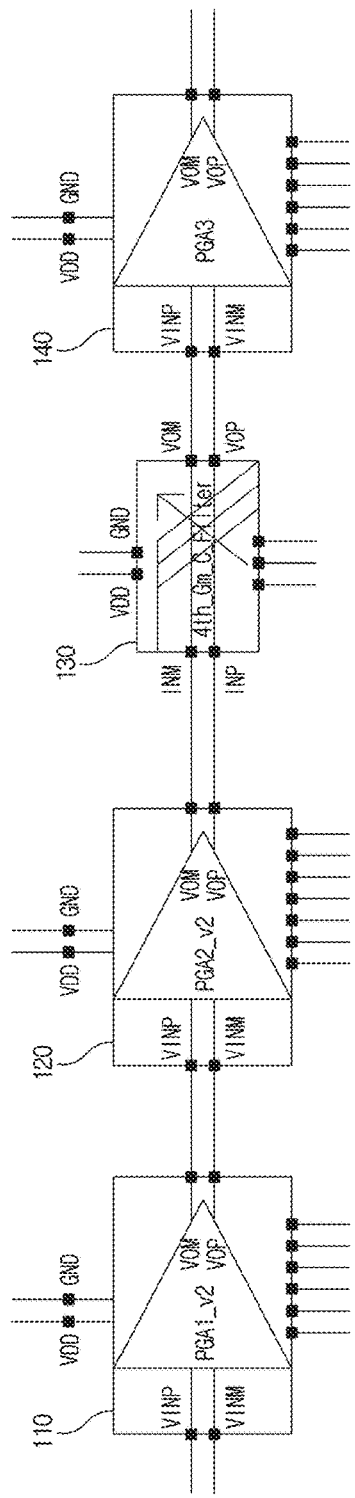
FIG. 5 is a circuit diagram of an ALPF according to an embodiment of the present disclosure.

FIG. 5 is a circuit diagram of a level adjustment low pass filter (ALPF) according to an embodiment of the present disclosure. The ALPF according to the embodiment of the present disclosure smoothes an input signal having a magnitude that is inversely proportional to a biquadrate of a distance from an object regardless of the distance, and outputs the smoothed signal.

The ALPF according to the embodiment of the present disclosure for performing such functions includes an amplification unit-1 110, an amplification unit-2 120, an LPF 130 and a buffer 140 as illustrated in FIG. 5.

The amplification unit-1 110 and the amplification unit-2 120 can include a circuit that processes a received radar signal. The amplification unit-1 110 performs an attenuation processing on a magnitude of a low frequency band of the received signal, and the amplification unit-2 120 performs an attenuation processing one again on the magnitude of the low frequency band of the signal that has been attenuated by the amplification unit-1 110.

The LPF 130 performs a low frequency pass filtering on an output signal of the amplification unit-2 120. This is to rapidly attenuate a signal of a high band that is higher than 33.3 MHz, that is the maximum frequency of the received signal.

The buffer 140 amplifies the output signal of the LPF 130. This is a circuit for compensating the gain attenuation made by the amplification unit-1 110, the amplification unit-2 120 and the LPF 130 located in the front end.

The structure of the amplifier core of the amplification unit-1 110 and the amplification unit-2 120 will be explained in detail with reference to FIG. 6. Since the structure of the amplifier core of the amplification unit-1 110 and the amplification unit-2 120 may be realized identically, FIG. 6 illustrates a circuit diagram of only one amplifier core.

Figure 6:
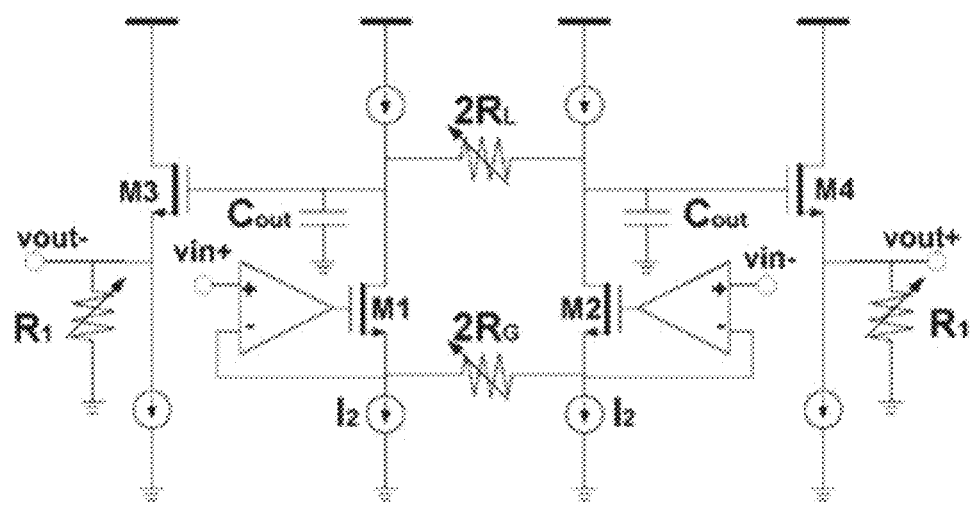
FIG. 6 is a circuit diagram of an amplifier core configuring an amplification unit of an ALPF.

As illustrated in FIG. 6, the amplifier includes four transistors: M1, M2, M3, M4. A primary amplification is performed by the transistors M1, M2 at the input side, and a secondary amplification is performed by the transistors M3, M4 at the output side.

A gate and an emitter of the transistors M1, M2 provided at the input side are connected by an OP amp. This OP amp is an element that negative feedbacks the emitter of the transistors M1, M2 to the gate, and that amplifies the gain (gm) of the transistors M1, M2.

The gain of the transistors M1, M2 may be adjusted/determined to a ratio ($R_L/R_G$) of a 2 $R_L$ that connects drains of the transistors M1, M2 and a 2 $R_G$ that connects sources of the transistors M1, M2.

Figure 7:
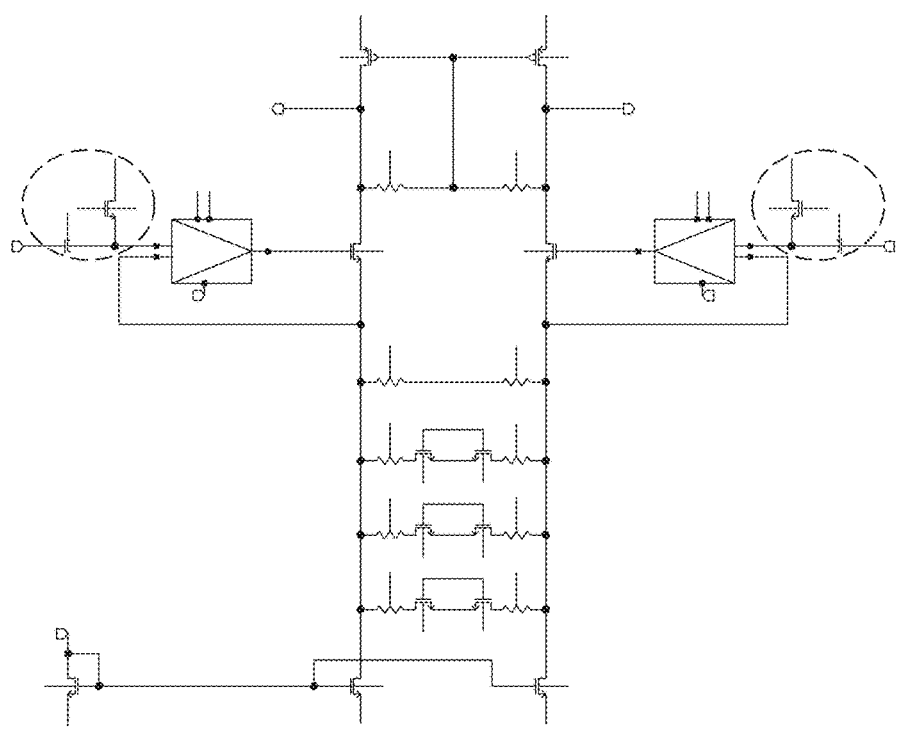
FIG. 7 is a detailed circuit regarding an input side of an amplifier core.

FIG. 7 is a detailed circuit diagram regarding the input side of the amplifier core illustrated in FIG. 6. FIG. 7 further illustrates R-C high pass filters (HPFs) that are connected to a (+) input terminal of the OP amps. They are the portions indicated in circular dotted lines.

The corner frequency of these HPFs may be adjusted by a voltage control resistance, and preferably to the highest frequency of the received signal. In the case where the received signal is in a situation such as FIG. 3, the corner frequency is set to 33.3 MHz.

By these HPFs, the magnitude of the low frequency band of the received signal is attenuated. The amplifier core performs amplification on the signal of which the magnitude of the low frequency band has been attenuated.

Figure 8:
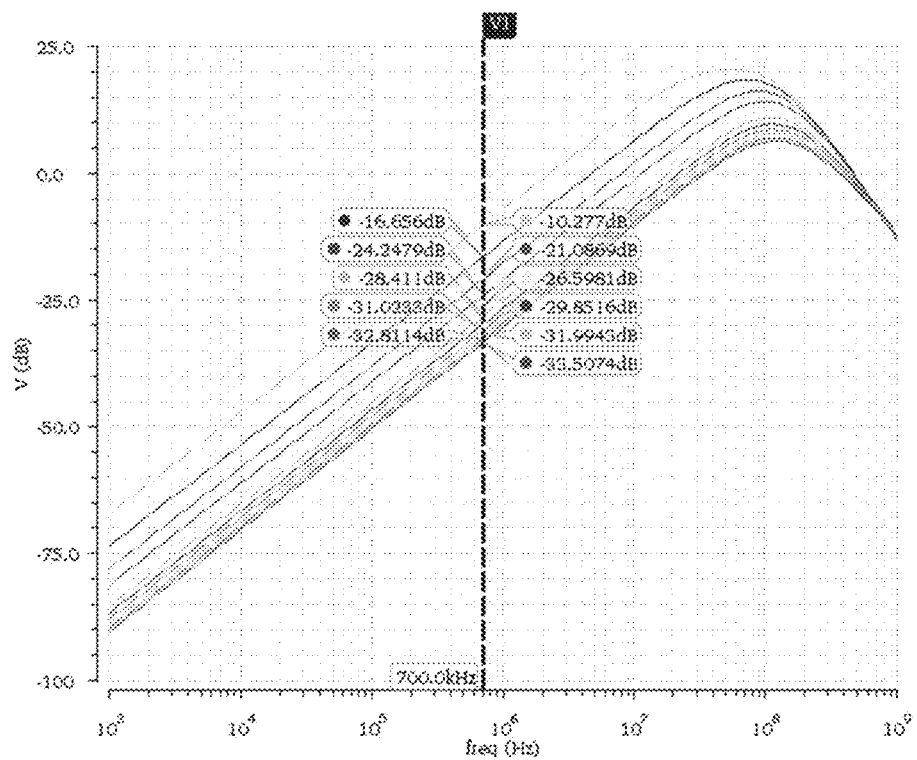
FIG. 8 is a view illustrating attenuation characteristics of a high frequency band signal according to corner frequency adjustment.

FIG. 8 shows attenuation characteristics of the low frequency band signal according to corner frequency adjustment. The characteristics illustrated in FIG. 8 show that a signal that is inversely proportional to a square of a distance from a target can be smoothed by the HPF.

Meanwhile, according to the illustrations in FIG. 5, since the amplification unit 110, 120 is connected to a cascade at two ends, attenuation of the magnitude of the low frequency band is performed twice.

That is, the magnitude of the low frequency band of a received signal is attenuated by the HPF provided in the amplification unit-1 110, and the magnitude of the low frequency band of the received signal is attenuated by the HPF provided in the amplification unit-2 120.

Accordingly, it becomes possible to smooth the magnitude of the received signal that is inversely proportional to the biquadrate of the distance from the target.

Figure 9:
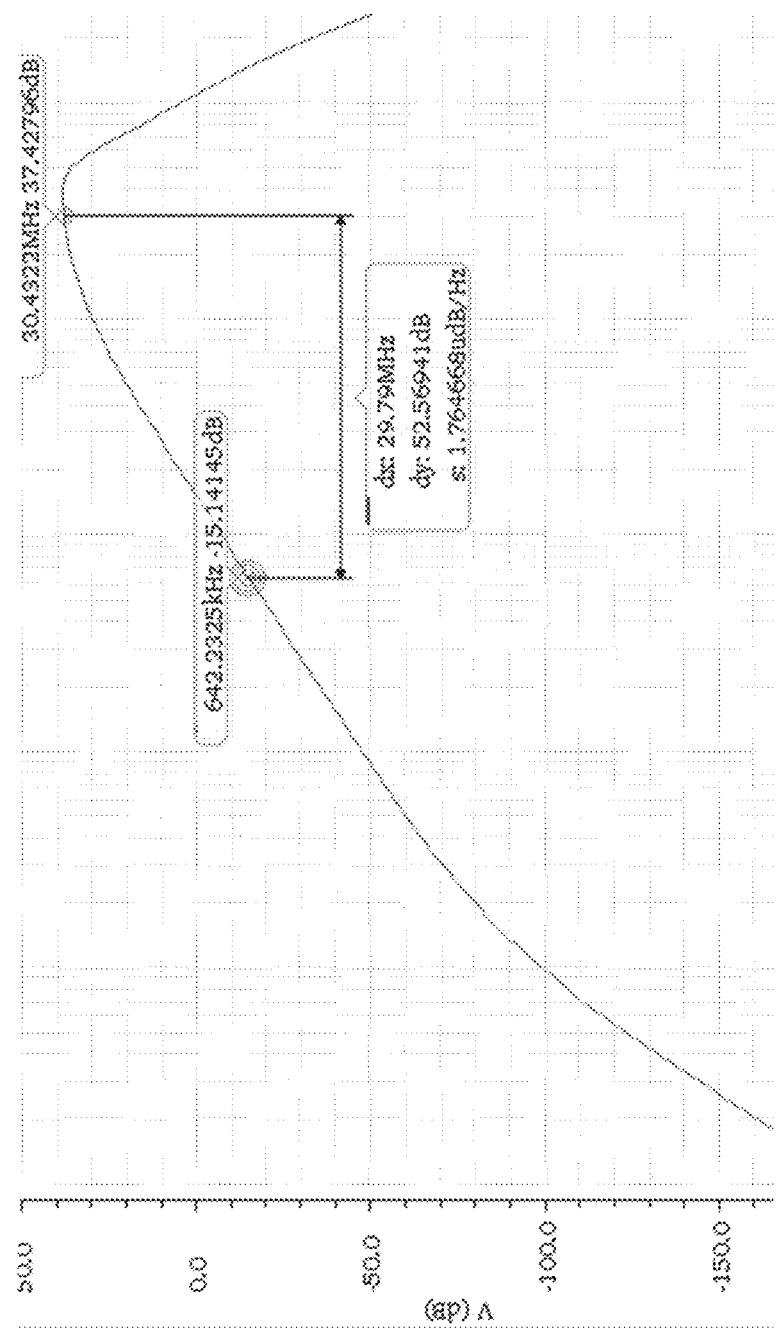
FIG. 9 is a view illustrating a simulation result regarding an entire gain curve of an ALPF.

FIG. 9 shows simulation results regarding the entire gain curve of the ALPF according to the embodiment of the present disclosure illustrated in FIG. 1. As illustrated in FIG. 9, the ALPF according to the embodiment of the present disclosure has an output range of ~6 dB, and thus compared to a conventional ALPF having an output range of 66 dB, one can see that a signal can be sufficiently demodulated with a low resolution ADC.

Figure 10:
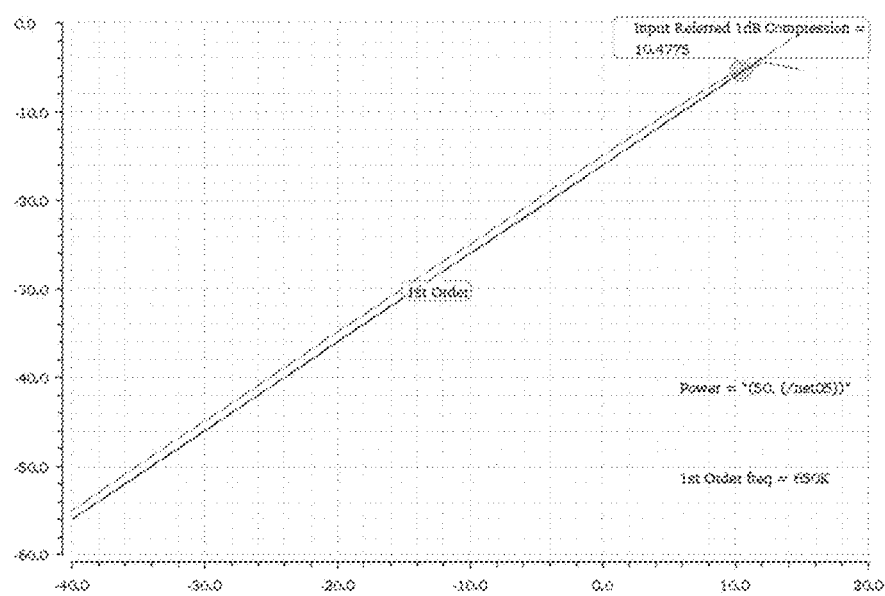
FIG. 10 is a graph illustrating the linearity regarding a low frequency signal of an ALPF.

As illustrated in FIG. 10, the ALPF according to the embodiment of the present disclosure has a high linearity of 10 dBm or more regarding the low frequency signal, making it possible to realize an entire chip of the radar receiver in one chip.

So far, the ALPF was explained in detail based on a preferable embodiment.

In the aforementioned embodiment, the amplification unit 110, 120 was configured in two ends, but the technical idea of the present disclosure may of course be applied to cases where the amplification unit 110, 120 is realized in one or three ends or more as well.

Further, in the aforementioned embodiment, it was supposed that the corner frequency of the HPF provided in the input end of the amplifier core of the amplification unit 110, 120 is adjusted to the highest frequency of the received signal, but this is a mere example, and thus changes may be made thereto.

For example, it is possible to set the corner frequency of the HPF provided in the amplification unit-2 120 to be lower than the highest frequency (for example, 90% of the highest frequency), and lower than the corner frequency of the HPF provided in the amplification unit-1 110. This reflects that the actual attenuation rate regarding the high frequency received signals near the corner frequency may fall short of the (−) negative biquadrate of the distance.

Moreover, in compensation for setting the corner frequency low, the gain in the amplifier core of the amplification unit-2 120 may be set lower than the gain in the amplifier core of the amplification unit-1 110.

Figure 11:
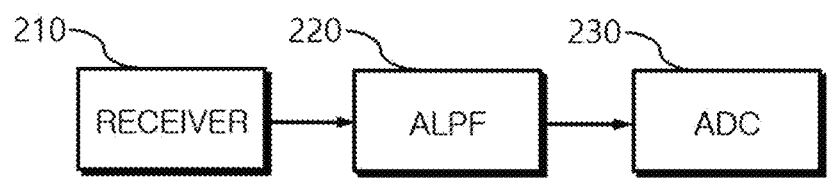
FIG. 11 is a block diagram of a radar receiver according to another embodiment of the present disclosure.

FIG. 11 is a block diagram of a radar receiver according to another embodiment of the present disclosure. The radar receiver according to the embodiment of the present disclosure includes a receiver 210, an ALPF 220 and an ADC 230 as illustrated in FIG. 11.

The receiver 210 receives a radar signal emitted from a radar transmitter (not illustrated) and reflected from the target.

The ALPF 220 is a signal processing element for smoothing and outputting the radar signal received by the receiver 210, and may be realized as the ALPF illustrated in FIG. 5.

The ADC 230 A/D converts the signal being output from the ALPF 220 into a digital signal, and then outputs the converted digital signal.

The radar receiver illustrated in FIG. 11 may be utilized as a receiving end baseband circuit of a radar system for vehicles, a radar system for object detection, and a military radar system.

In the drawings and specification, there have been disclosed typical embodiments of the inventive technology, and although specific terms are employed, they are used in a generic and descriptive sense only and not for purposes of limitation. It will be understood by those of ordinary skill in the art that various changes in form and details may be made therein without departing from the spirit and scope of the present invention as defined by the following claims.

What is claimed is:

1. A single-chip radar receiver comprising:
a receiver circuit configured to receive a radar signal having a low frequency component;
a level adjustment low pass filter (ALPF) connected to the receiver circuit and configured to process the received radar signal to generate an analog output signal;
an analog-to-digital converter (ADC) connected to the ALPF and configured to convert the analog output signal of the ALPF into a digital signal,
wherein the ALPF comprises:
   a first high pass filter (HPF) configured to attenuate the low frequency component of the radar signal to generate an output signal, the first HPF having a first corner frequency;
   a first amplifier configured to first amplify the output signal of the first HPF, the first amplified output signal including a low frequency component;
   a second HPF configured to attenuate the low frequency component of the first amplified output signal, the second HPF having a second corner frequency;
   a second amplifier configured to second amplify an output signal of the second HPF;
   a low pass filter (LPF) configured to perform low pass filtering on the second amplified output signal to generate an LPF output; and
   a buffer configured to amplify the LPF output to compensate gain attenuation of the first HPF, the first amplifier, the second HPF, the second amplifier, and the LPF,
wherein the second corner frequency is configured to be set to a frequency lower than the first corner frequency, and wherein the second amplifier is configured to be set to have an amplification gain less than that of the first amplifier to compensate lower corner frequency setting of the second HPF.

2. The radar receiver of claim 1, wherein the first corner frequency is equal to or lower than a predetermined highest frequency of the radar signal.

3. The radar receiver of claim 1, wherein the first amplifier comprises:
   one pair of first transistors; and
   first amps configured to negative feedback an emitter of the first transistors to a gate, and amplify a gain of the first transistors, and
wherein the second amplifier comprises:
   one pair of second transistors; and
   second amps configured to negative feedback an emitter of the second transistors to the gate, and amplify a gain of the second transistors.

4. The radar receiver of claim 3, wherein the gain of the first amplifier is configured to be adjusted by a ratio of an first resistance that connects drains of the first transistors and a second resistance that connects the emitters of the first transistors, and
wherein the gain of the second amplifier is configured to be adjusted by a ratio of a third resistance that connects drains of the second transistors and a forth resistance that connects the emitters of the second transistors.

* * * * *